US006636126B1

(12) United States Patent
Pozdeev

(10) Patent No.: US 6,636,126 B1
(45) Date of Patent: Oct. 21, 2003

(54) FOUR PORT HYBRID

(75) Inventor: Oleg Pozdeev, Akersberga (SE)

(73) Assignee: Allgon AB, Taby (SE)

( * ) Notice: Subject to any disclaimer, the term of this patent is extended or adjusted under 35 U.S.C. 154(b) by 9 days.

(21) Appl. No.: 10/069,108

(22) PCT Filed: Aug. 23, 2000

(86) PCT No.: PCT/SE00/01621

§ 371 (c)(1),
(2), (4) Date: Feb. 27, 2002

(87) PCT Pub. No.: WO01/17058

PCT Pub. Date: Mar. 8, 2001

(51) Int. Cl.[7] ..................... H01P 5/22; H01P 3/08; H03H 5/00

(52) U.S. Cl. ..................... 333/117; 333/26; 333/238; 333/246

(58) Field of Search ..................... 333/117, 246, 333/238, 26

(56) References Cited

U.S. PATENT DOCUMENTS

| | | | | | |
|---|---|---|---|---|---|
| 4,186,352 | A | * | 1/1980 | Hallford | 455/327 |
| 4,316,160 | A | * | 2/1982 | Dydyk | 333/120 |
| 4,810,982 | A | * | 3/1989 | Wong | 333/115 |
| 5,001,492 | A | * | 3/1991 | Shapiro et al. | 343/700 MS |
| 5,521,563 | A | | 5/1996 | Mazzochette | 333/116 |
| 5,742,210 | A | | 4/1998 | Chaturvedi et al. | 333/116 |
| 6,346,863 | B2 | * | 2/2002 | Sasaki et al. | 333/116 |
| 6,483,415 | B1 | * | 11/2002 | Tang | 336/200 |

* cited by examiner

*Primary Examiner*—Patricia Nguyen
(74) *Attorney, Agent, or Firm*—Jacobson Holman PLLC

(57) ABSTRACT

The present invention relates to a four port hybrid comprising a first set (10) of N coupled transmission lines (10A, 10B, 10C, 10D, 10E, 10F, 10G, 10H, 10I) and a second set (20) of N coupled transmission lines (20A, 20B, 20C, 20D, 20E, 20F, 20G, 20H, 20I) where N≧4. Said coupled transmission lines in said first set (10) are electrically connected to said coupled transmission lines in said second set (20) to form a first spiral shaped electrical conductive path, a second spiral shaped electrical conductive path and N−1 electrically isolated transposition portions (30, 40, 50, 60, 70, 80, 90, 110) of said first and second spiral shaped electrical conductive paths. A first end of the first spiral being an input port (P1). A first end of the second spiral being a port (P4) connectable to ground. A second end of the first spiral being a first output port (P3) and a second end of the second spiral being a second output port (P2).

8 Claims, 6 Drawing Sheets

100A

100A

100E

FOUR PORT HYBRID

This is a nationalization of PCT/SE00/01621 filed Aug. 23, 2000 and published in English.

FIELD OF THE INVENTION

The present invention relates to microwave radio frequency transmission line circuits generally and more specifically to four port hybrids.

DESCRIPTION OF THE RELATED ART

The requirement to integrate as much as possible in even smaller volumes calls for the study and development of new types of hybrids.

Hybrids are per se well known and well understood in this art in its waveguide, coaxial, microstrip and stripline forms. Typical prior art hybrids are branch directional coupler, Lange coupler and tandem coupler. These hybrids are fundamentally four port devices that accept a signal at an input port, divide the signal in half internally and then supply the divided signal to two output ports. In an ideal quadrature hybrid, the difference in phase angle between the output ports remains at 90 degrees and the amplitude of the output signals remain equal across the useful bandwidth of the device. There is essentially no output from the fourth port as it is isolated from the input port, and in many instances said port is terminated internally. Once the input port is selected the others are defined automatically.

The most common hybrid structure is a branch directional coupler. The problem with said hybrid is too large to be of any interest at a frequency band used in mobile telephones, e.g. a GSM or a PCS frequency band.

Another hybrid is the one based on coupled lines arranged on one side of a dielectric substrate. The problem with said hybrid is that it cannot be realised using standard PCB technology due to too narrow gap between.

Yet another hybrid is the one based on coupled lines arranged on opposite sides of a dielectric substrate. The problem with said hybrid is that the physical dimensions are too large and the necessity to use both sides of said substrate with the added problem of double sided alignment.

A further hybrid is the so called Lange coupler. The problem with said hybrid is that the required 3 dB coupling between the transmission lines has to be done with narrow transmission lines which are too narrow to be cross connected by commercially available PCB (Printed Circuit Board)-jumpers. Another problem with the lange coupler is that the physical dimension is too large to be of any interest in applications demanding small is space.

Still another hybrid is the so called tandem coupler. The problem with said hybrid is that the physical dimension is too large.

SUMMARY OF THE INVENTION

It is an object of the present invention to provide a four port hybrid which overcomes or at least reduces the above mentioned problems.

Another object of the present invention is to provide a hybrid with comparably small physical dimensions and improved electrical parameters.

According to the present invention there is provided a four port hybrid as claimed in claim 1.

One advantage with the present invention is that the hybrid can be manufactured in stripline or microstrip with comparably wide strips and comparably wide gaps between said strips that results in a high Q-factor of the transmission lines which in turn leads to small insertion loss.

Another advantage with the present invention is that the hybrid is less sensitive to fabrication tolerances and by that is inexpensive to manufacture.

Yet another advantage is that the present invention being small enough to make an implementation in MMIC (Monolithic Microwave Integrated circuit) technology possible.

Still another advantage is that the present invention has improved both reflection and insertion loss compared to already existing hybrids.

The invention will now be described in more detail with reference to preferred embodiments thereof and also with reference to the accompanying drawings.

DESCRIPTION OF A PREFERRED EMBODIMENTS

Figure 1:
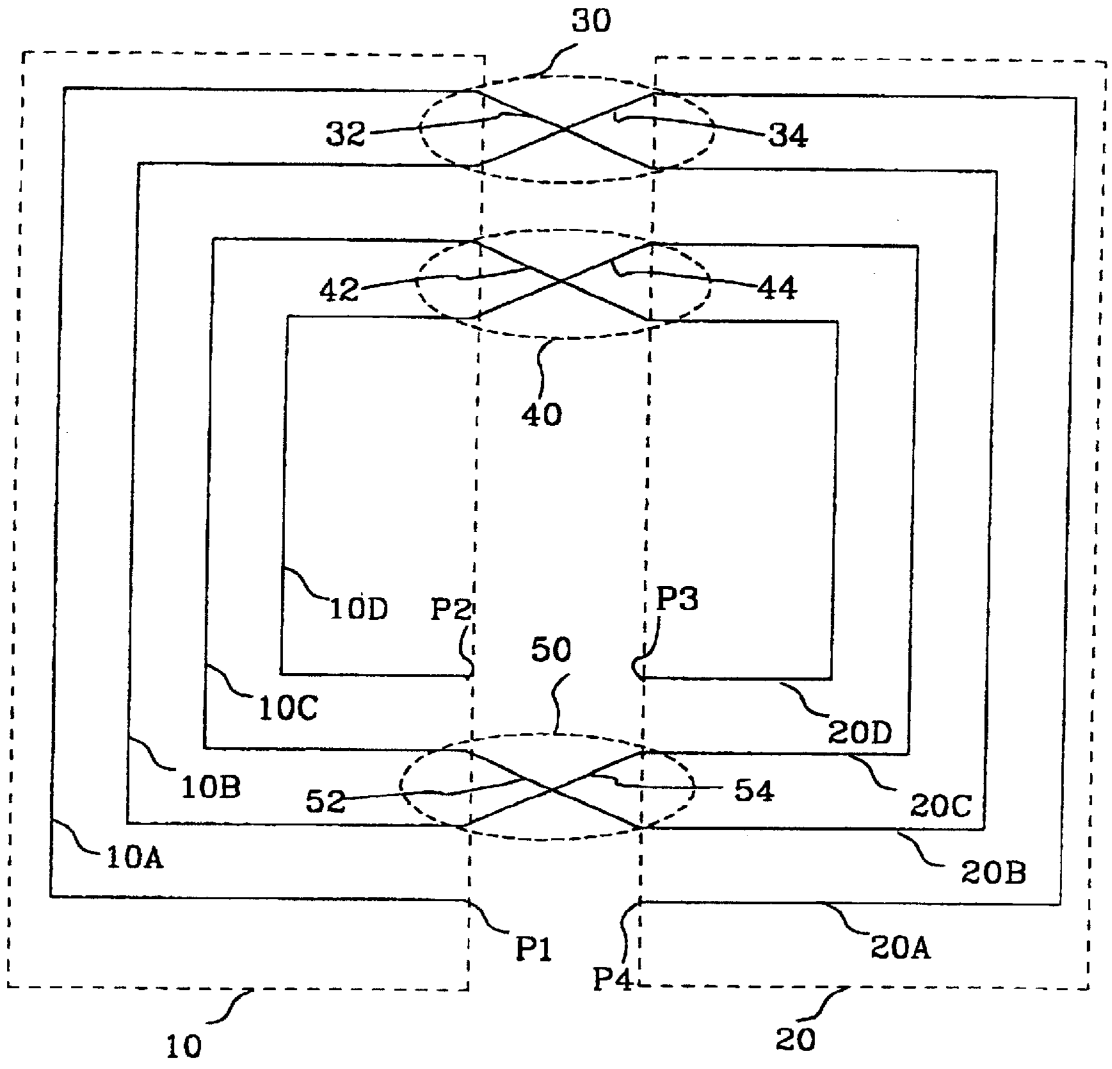
FIG. 1 shows a schematic view of a first embodiment of a four port hybrid according to the present invention.

With reference to FIG. 1, a schematic view of a first embodiment of a four port hybrid 100A according to the invention is shown. The hybrid 100A comprising a first set 10 and a second set 20 of multiple coupled transmission lines. Said first set of multiple coupled transmission lines 10 comprising a first transmission line 10A, a second transmission line 10B, a third transmission line 10C and a fourth transmission line 10D. Said second set of multiple coupled transmission lines 20 comprising a first transmission line 20A, a second transmission line 20B, a third transmission line 20C and a fourth transmission line 20D. In the present embodiment the transmission lines 10A, 10B, 10C, 10D, 20A, 20B, 20C, 20D are C-shaped. The first transmission line 10A, 20A is the longest one and the second 10B, 20B, third 10C, 20C and fourth 10D, 20D are decreasing by gradual stages. All transmission lines 10A, 10B, 10C, 10D in the first set 10 are mutually coupled and said coupling between said transmission lines is of electromagnetic nature. The same applies to the second set of multiple coupled transmission lines 20. A first end of the first transmission line 10A in the first set of coupled transmission lines 10 being an input port P1. A second end of said transmission line 10A is electrically connected to a second end of the second transmission line in the second set of coupled transmission lines via an electrical conductor 32. A first end of the second transmission line 20B in the second set of coupled transmission lines 20 is electrically connected to a first end of the third transmission line 10C in the first set of coupled transmission lines 10 via an electrical conductor 52. A second end of the third transmission line in the first set of coupled transmission lines is electrically connected to a fourth transmission line 20D in the second set of multiple coupled transmission lines 20 via an electrical conductor 42. A first end of the fourth transmission line in the second set of coupled transmission lines being a first output port P3. The first transmission line 10A in the first set 10, the second transmission line 20B in the second set 20, is the third transmission line 10C in the first set 10 and the fourth transmission line 20D in the second set 20 coupled electrically to each other via said electrical conductors 32, 42, 52 are forming a first spiral shaped electrical conductive path.

A first end of the first transmission line 20A in the second set of coupled lines 20 being a terminated (isolated) port. A second end of the first transmission line 20A in the second set of coupled transmission lines 20 is electrically connected to a second end of the second transmission line 10B in the first set of coupled transmission lines 10 via an electrical conductor 34. A first end of the second transmission line 10B in the first set of multiple coupled transmission lines 10 is electrically connected to a first end of a third transmission line 20C in the second set of coupled transmission lines 20 via an electrical conductor 54. A second end of the third transmission line 20C in the second set of coupled transmission lines 20 is electrically connected to a second end of a fourth transmission line 10D in the first set of coupled transmission lines via an electrical conductor 44. A first end of the fourth transmission line 10D in the first set of coupled lines being a second output port P2. The first transmission line 20A in the second set 20, the second transmission line 10B in the first set 10, the third transmission line 20C in the second set 20 and the fourth transmission line 10D in the first set of multiple coupled transmission lines 20 are coupled electrically to each other via said electrical conductors 34, 44, 54 are forming a second spiral shaped electrical conductive path.

In the spiral shaped electrical conductive paths every second half turn of said spiral are belonging to the first set of coupled transmission lines and between said half turns the transmission lines belonging to the second set of transmission lines are arranged.

In the embodiment shown in FIG. 1 there are three electrically isolated transposition portions 30, 40, 50 of the first and second spiral shaped conductive paths. Said electrically isolated transposition portions can be looked upon as four port lumped cross connectors. In a first transposition portion 30 the electrical conductors 32, 34 connecting the second end of the first transmission line 10A in the first set of coupled lines 10 to the second end of the second transmission line 20B in the second set of coupled lines 20 and the second end of the second transmission line 10B in the first set of coupled transmission lines 10 to the second end of the first transmission line 20A in the second set of coupled transmission lines 20 respectively. In a second transposition portion 40 the electrical conductors 42, 44 connecting the second end of the third transmission line 10C in the first set of coupled lines 10 to the second end of the fourth transmission line 20D in the second set of coupled lines 20 and the second end of the fourth transmission line 10D in the first set of coupled transmission lines 10 to the second end of the third transmission line 20C in the second set of coupled transmission lines 20 respectively. In a third transposition portion 50 the electrical conductors 52, 54 connecting the first end of the second transmission line 10B in the first set of coupled lines 10 to the first end of the third transmission line 20C in the second set of coupled lines 20 and the first end of the third transmission line 10C in the first set of coupled transmission lines 10 to the first end of the second transmission line 20B in the second set of coupled transmission lines 20 respectively.

Figure 2:
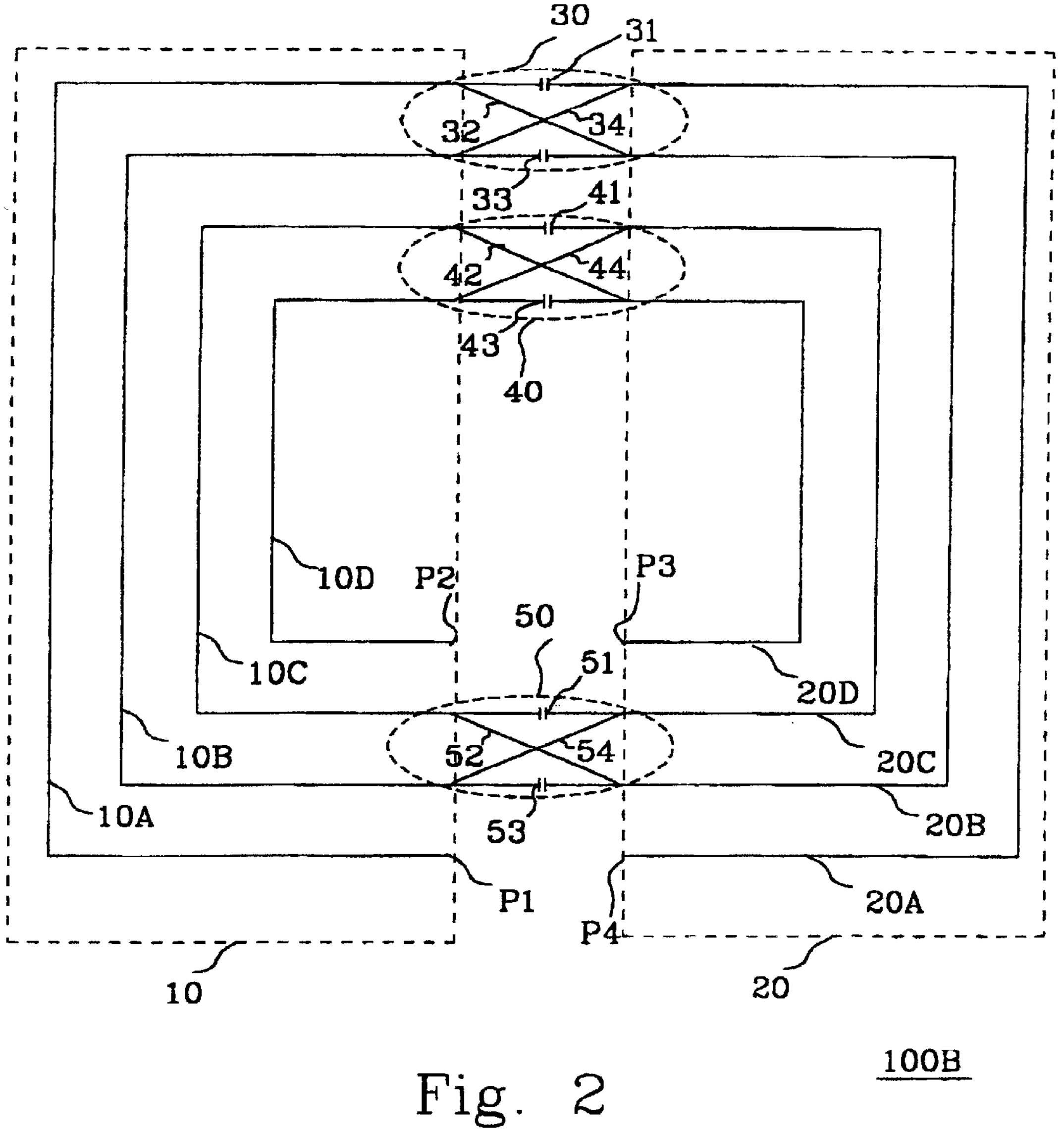
FIG. 2 shows a schematic view of a second embodiment of a four port hybrid according to the present invention.

With reference to FIG. 2, another embodiment of a four pore hybrid 100B according to the invention is shown. The structure of the hybrid 100B is the same as the one shown in FIG. 1 except for the only difference of further comprising six capacitors 31, 33, 41, 43, 51, 53. A first capacitor 31 is coupled between the second end of the first transmission line 10A in the first set of coupled lines 10 and the second end of the first transmission line 20A in the second set of coupled transmission lines. A second capacitor 32 is coupled between the second end of the second transmission line 10B in the first set of coupled lines 10 and the second end of the second transmission line 20B in the second set of coupled transmission lines 20. A third capacitor 41 is coupled between the second end of the third transmission line 10C in the first set of coupled lines 10 and the second end of the third transmission line 20C in the second set of multiple coupled transmission lines 20. A fourth capacitor 43 is coupled between the second end of the fourth transmission line 10D in , the first set of coupled lines 10 and the second end of the fourth transmission line 20D in the second set of coupled transmission lines 20. A fifth capacitor 51 is coupled between the first end of the third transmission line 10C in the first set of coupled lines 10 and the first end of the third transmission line 20C in the second set of coupled transmission lines 20. A sixth capacitor 53 is coupled between the first end of the second transmission line 10B in the first set of coupled lines 10 and the first end of the second transmission line 20B in the second set of coupled transmission lines 20. Said capacitors are forming further RF connections between the transmission lines in the first and second set of coupled transmission lines. Said capacitors will improve directivity of the hybrid by equalizing phase velocities of different modes propagating in the hybrid.

Figure 3:
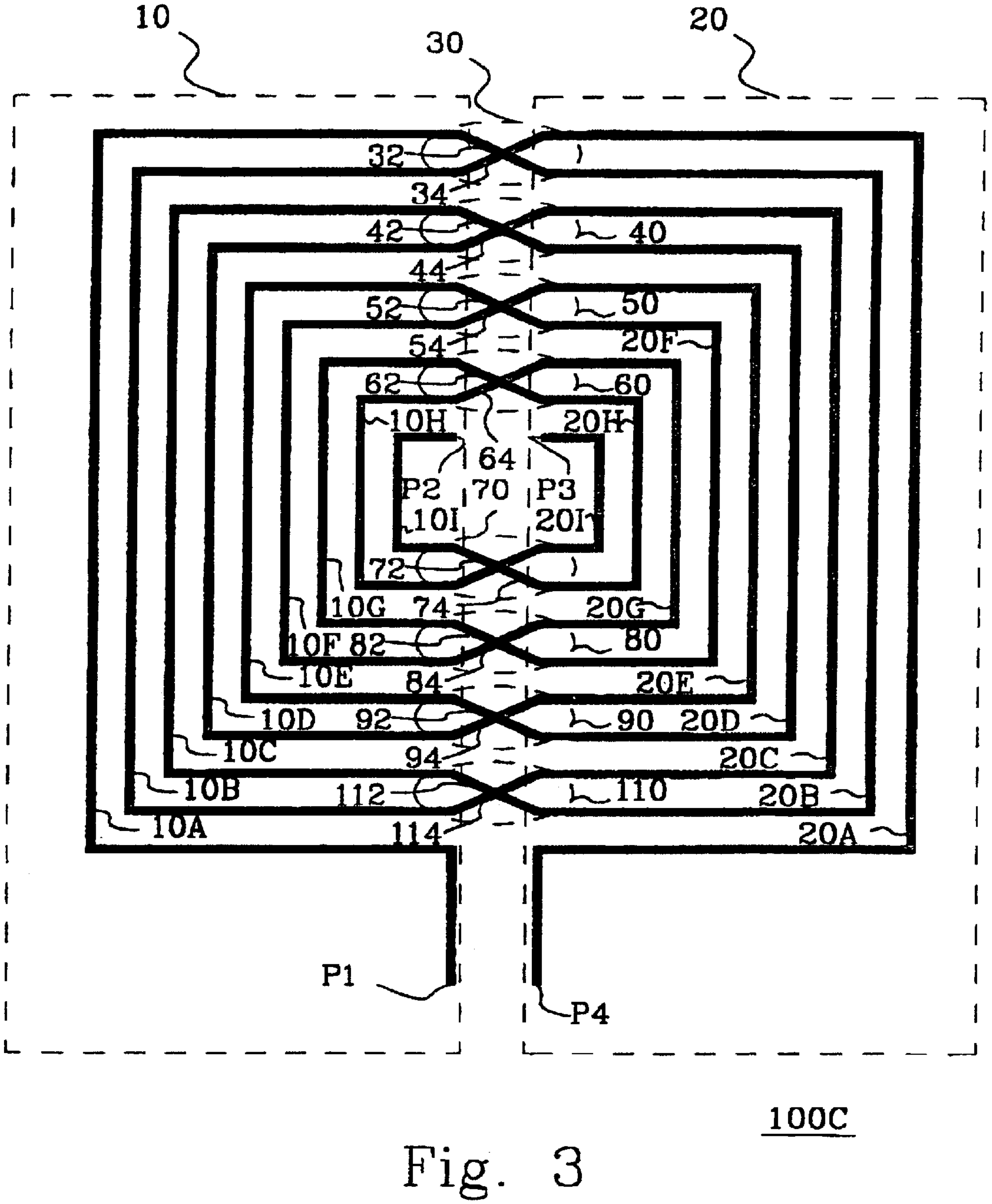
FIG. 3 shows a schematic view of a third embodiment of a four port hybrid according to the present invention.

With reference to FIG. 3, yet another embodiment of a four port hybrid 100C according to the invention is shown. The hybrid 100C comprising a first set 10 and a second set 20 of coupled transmission lines. Said first set of coupled transmission lines 10 comprising a first transmission line 10A, a second transmission line 10B, a third transmission line 10C, a fourth transmission line 10D, a fifth transmission line 10E, a sixth transmission line 10F, a seventh transmission line 10G, a eighth transmission line 10H and a ninth transmission line 101. Said second set of transmission lines 20 comprising a first transmission line 20A, a second transmission line 20B, a third transmission line 20C, a fourth transmission line 20D, a fifth transmission line 20E, a sixth transmission line 20F, a seventh transmission line 20G, a eighth transmission line 20H and a ninth transmission line 20I. In the present embodiment the transmission lines 10A, 10B, 10C, 10D, 10E, 10F, 10G, 10H, 10I, 20A, 20B, 20C, 20D, 20E, 20F, 20G, 20H, 20I are C-shaped. The first transmission lines 10A, 20A are the longest ones and the second 10B and 20B, third 10C and 20C, fourth 10D and 20D, fifth 10E and 20E, sixth 10F and 20P, seventh 10G and 20G, the eighth 10H and 20H and the ninth 101 and 20I are decreasing by gradual stages. All transmission lines 10A, 10B, 10C, 10D, 10E, 10F, 10G, 10H 10I in the first set 10 are mutually coupled and said coupling between the transmission lines is of electromagnetic nature. The same applies to the transmission lines in the second set of coupled transmission lines 20. A first end of the first transmission line 10A in the first set of coupled transmission lines 10 being an input port P1. A second end of said transmission line 10A is electrically connected to a second side of the second transmission line 20B in the second set of coupled transmission lines 20 via an electrical conductor 32. A first side of the second transmission line 20B in the second set of coupled transmission lines 20 is electrically connected to a first side of the third transmission line 10C in the first set of coupled transmission lines 10 via an electrical conductor 112. A second end of the third transmission line 10C in the first set of coupled transmission lines is electrically connected to a second end of the fourth transmission line 20D in the second set of coupled transmission lines via an electrical conductor 42. A first end of the fourth transmission line 20D in the second set of coupled transmission lines 20 is electrically connected to a first side of the fifth transmission line 10B in the first set of coupled transmission lines 10 via an electrical conductor 92. A second end of the fifth transmission line 10E in the first set of coupled transmission lines 10 is electrically connected to a second end of the sixth transmission line 20F in the second set of coupled transmission lines via an electrical conductor 52. A first side of the sixth transmission line 20F in the second set of coupled transmission lines 20 is electrically connected to a first side of the seventh transmission line 10G in the first set of coupled transmission lines 10 via an electrical conductor 82. A second end of the seventh transmission line 10F in the first set of coupled transmission lines 10 is electrically connected to a second end of the eighth transmission line 20H in the second set of coupled transmission lines via an electrical conductor 62. A first side of the eighth transmission line 20H in the second set of coupled transmission lines 20 is electrically connected to a first side of the ninth transmission line 100 in the first set of coupled transmission lines 10 via an electrical conductor 72.

The first transmission line 10A in the first set 10, the second transmission line 20B in the second set 20, the third transmission line 10C in the first set 10 and the fourth transmission line 20D in the second set 20 The fifth transmission line 10E in the first set 10, the sixth transmission line 20F in the second set 20, the seventh transmission line 10G in the first set 10 and the eighth transmission line 20H in the second set 20 and the ninth transmission line in the first set are coupled electrically to each other via said electrical conductors 32, 112, 42, 92, 52, 82, 62, 72 are forming a first spiral shaped electrical conductive path.

A first end of the first transmission line 20A in the second set of coupled lines 20 being a terminated (isolated) port. Said termination is usually made with a system impedance which commonly is 50Ω. A second end of the first transmission line 20A in the second set of coupled transmission lines 20 is electrically connected to a second end of the second transmission line 10B in the first set of coupled transmission lines 10 via an electrical conductor 34. A first end of the second transmission line 10B in the first set of coupled transmission lines 10 is electrically connected to a first end of a third transmission line 20C in the second set of coupled transmission lines 20 via an electrical conductor 114. A second end of the third transmission line 20C in the second set of coupled transmission lines 20 is electrically connected to a second end of a fourth transmission line 10D in the first set of coupled transmission lines via an electrical conductor 44. A first end of the fourth transmission line 20D in the first set of coupled transmission lines 10 is electrically connected to a first side of the fifth transmission line 10E in the second set of coupled transmission lines 10 via an electrical conductor 94. A second end of the fifth transmission line 20E in the second set of coupled transmission lines 20 is electrically connected to a second end of the sixth transmission line 10F in the first set of coupled transmission lines via an electrical conductor 54. A first end of the sixth transmission line 10F in the first set of coupled transmission lines 10 is electrically connected to a first side of the seventh transmission line 20G in the second set of coupled transmission lines 20 via an electrical conductor 84. A second end of the seventh transmission line 20F in the second set of coupled transmission lines 20 is electrically connected to a second end of the eighth transmission line 10H in the first set of coupled transmission lines via an electrical conductor 64. A first side of the eighth transmission line 10H in the first set of coupled transmission lines 10 is electrically connected to a first side of the ninth transmission line 20I in the second set of coupled transmission lines 20 via an electrical conductor 74.

A second end of the ninth transmission line 20I in the second set of coupled lines being a second output port P3.

The first transmission line 20A in the second set 20, the second transmission line 10B in the first set 10, the third transmission line 20C in the second set 20 and the fourth transmission line 10D in the first set 10, the fifth transmission line 20E in the second set 20, the sixth transmission line 10F in the first set 10, the seventh transmission line 20G in the second set 20, the eighth transmission line 10H in the first set 10 and the ninth transmission line 201 in the second set 20 are coupled electrically to each other via said electrical conductors 34, 114, 44, 94, 54, 84, 64, 74 and forming a second spiral shaped electrical conductive path.

In the spiral shaped electrical conductive paths every second half turn of said spiral are belonging to the first set of coupled transmission lines and between said half turns the transmission lines belonging to the second set of transmission lines are arranged.

In the embodiment shown in FIG. 3 there are eight electrically isolated transposition portions 30, 40, 50, 60, 70, 80, 90, 110 of the first and second spiral shaped electrical conductive paths. Said electrically isolated transposition portions can be looked upon as four port cross connectors. In a first transposition portion 30 the electrical conductors 32, 34 connecting the second end of the first transmission line 10A in the first set of coupled lines 10 to the second end of the second transmission line 20B in the second set of coupled lines 20 and the second end of the second transmission line 10B in the first set of coupled transmission lines 10 to the second end of the first transmission line 20A in the second set of coupled transmission lines 20 respectively.

In a second transposition portion 40 the electrical conductors 42, 44 connecting the second end of the third transmission line 10C in the first set of coupled lines 10 to the second end of the fourth transmission line 20D in the second set of coupled lines 20 and the second end of the fourth transmission line 10D in the first set of coupled transmission lines 10 to the second end of the third transmission line 20C in the second set of coupled transmission lines 20 respectively. In a third transposition portion 50 the electrical conductors 52, 54 connecting the second end of the fifth transmission is line 10E in the first set of coupled lines 10 to the second end of the sixth transmission line 20F in the second set of coupled lines 20 and the second end of the sixth transmission line 10F in the first set of coupled transmission lines 10 to the second end of the fifth transmission line 20E in the second set of coupled transmission lines 20 respectively. In a fourth transposition portion 60 the electrical conductors 62, 64 connecting the second end of the seventh transmission line 10G in the first set of coupled lines 10 to the second end of the eight transmission line 20H in the second set of coupled lines 20 and the second end of the eight transmission line 10H in the first set of coupled transmission lines 10 to the second end of the seventh transmission line 20G in the second set of coupled transmission lines 20 respectively. In a fifth transposition portion 70 the electrical conductors 72, 74 connecting the first end of the ninth transmission line 10I in the first set of coupled lines 10 to the first end of the eight transmission line 20H in the second set of coupled lines 20 and the first end of the eight transmission line 10H in the first set of coupled transmission lines 10 to the first end of the ninth transmission line 201 in the second set of coupled transmission lines 20 respectively.

In a sixth transposition portion 80 the electrical conductors 62, 84 connecting the second end of the seventh transmission line 10G in the first set of coupled lines 10 to the second end of the sixth transmission line 20F in the second set of coupled lines 20 and the second end of the sixth transmission line 10F in the first set of coupled transmission lines 10 to the second end of the seventh transmission line 20G in the second set of coupled transmission lines 20 respectively. In a seventh transposition portion 90 the electrical conductors 92, 94 connecting the first end of the fifth transmission line 10E in the first set of coupled lines 10 to the first end of the fourth transmission line 20D in the second set of coupled lines 20 and the first end of the fourth transmission line 10D in the first set of coupled transmission lines 10 to the first end of the fifth transmission line 20E in the second set of coupled transmission lines 20 respectively.

In a eighth transposition portion 110 the electrical conductors 112, 114 connecting the first end of the third transmission line 10C in the first set of coupled lines 10 to the first end of the second transmission line 20B in the second set of coupled lines 20 and the first end of the second transmission line 10B in the first set of coupled transmission lines 10 to the first end of the third transmission line 20C in the second set of coupled transmission lines 20 respectively.

Figure 4:
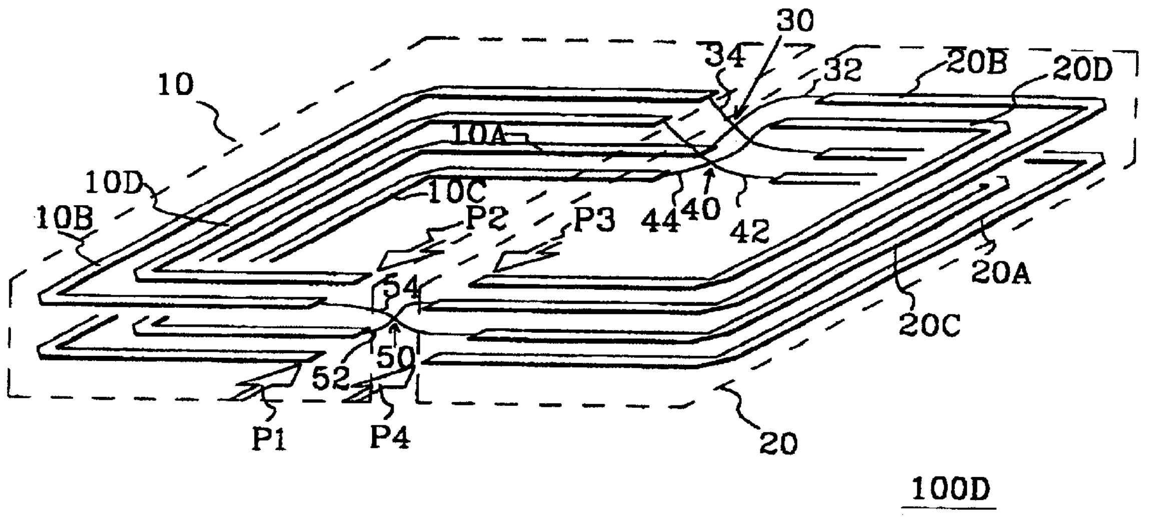
FIG. 4 shows a schematic view of a fourth embodiment of a four port hybrid according to the present invention.

With reference to FIG. 4, a schematic view of a fourth embodiment of a four port hybrid 100D according to the invention is shown. The hybrid 100D comprising a first set 10 and a second set 20 of coupled transmission lines. Said first set of coupled transmission lines 10 comprising a first transmission line 10A, a second transmission line 10B, a third transmission line 10C and a fourth transmission line 10D. Said second set of transmission lines 20 comprising a first transmission line 20A, a second transmission line 20B, a third transmission line 20C and a fourth transmission line 20D. In the present embodiment the transmission lines 10A, 10B, 10C, 10D, 20A, 20B, 20C, 20D are C-shaped. The first transmission lines 10A, 20A and the second transmission line 10B, 20B are the longest ones and the third transmission lines 10C, 20C and fourth transmission lines 10D, 20D are the shortest ones. All transmission lines 10A, 10B, 10C, 10D in the first set 10 are mutually coupled and said coupling is of electromagnetic nature. The same applies to every transmission line in the second set of coupled transmission lines 20 A first end of the first transmission line 10A in the first set of coupled transmission lines 10 being an input port P1. A second end of said transmission line 10A is electrically connected to a second side of the second transmission line 20B in the second set of coupled transmission lines via an electrical conductor 32. A first side of the second transmission line 20B in the second set of coupled transmission lines 20 is electrically connected to a first side of the third transmission line 10C in the first set of coupled transmission lines 10 via an electrical conductor 52. A second side of the third transmission line 10C in the first set of coupled transmission lines 10 is electrically connected to a fourth transmission line 20D in the second set of coupled transmission lines 20 via an electrical conductor 42. A first side of the fourth transmission line in the second set of coupled transmission lines being a first output port P3. The first transmission line 10A in the first set 10, the second transmission line 202 in the second set 20, the third transmission line 10C in the first set 10 and the fourth transmission line 20D in the second set 20 coupled electrically to each other via said electrical conductors 32, 42, 52 are forming a first spiral shaped electrical conductive path The first and third transmission lines 10A and 10C belonging to the first set of coupled transmission lines are arranged on a first side of a dielectric substrate and the second and third transmission lines 20B and 20C belonging to the second set of transmission lines are arranged on a second side of said dielectric substrate.

A first end of the first transmission line 20A in the second set of coupled lines 20 being a terminated (isolated) port. A second end of the first transmission line 20A in the second set of coupled transmission lines 20 is electrically connected to a second end of the second transmission line 10B in the first set of coupled transmission lines 10 via an electrical conductor 34. A first end of the second transmission line 10B in the first set of coupled transmission lines 10 is electrically connected to a first end of a third transmission line 20C in the second set of coupled transmission lines 20 via an electrical conductor 54. A second end of the third transmission line 20C in the second set of coupled transmission lines 20 is electrically connected to a second end of a fourth transmission line 10D in the first set of coupled transmission lines via an electrical conductor 44. A first end of the fourth transmission line 10D in the first set of coupled lines being a second output port P2. The first transmission line 20A in the second set 20, the second transmission line 10B in the first set 10, the third transmission line 20C in the second set 20 and the fourth transmission line 10D in the first set 20 connected electrically to each other via said electrical conductors 34, 44, 54 are forming a second spiral shaped electrical conductive path.

The first and third transmission lines 20A and 20C belonging to the second set of coupled transmission lines are arranged on the second side of the dielectric substrate and the second and third transmission lines 10B and 10C belonging to the first set of transmission lines are arranged on a first side of said dielectric substrate.

In the spiral shaped electrical conductive paths every second a half turn of said spiral are belonging to the first set of coupled transmission lines and between said half turns the transmission lines belonging to the second set of transmission lines are arranged.

In the embodiment shown in FIG. 1 there are three transposition portions 30, 40, 50 of the first and second spiral shaped conductive paths.

In a first transposition portion 30 the electrical conductors 32, 34 connecting the second end of the first transmission line 10A in the first set of coupled lines 10 to the second end of the second transmission line 20B in the second set of coupled lines 20 and the second end of the second transmission line 10B in the first set of coupled transmission lines 10 to the second end of the first transmission line 20A in the second set of coupled transmission lines 20 respectively.

In a second transposition portion 40 the electrical conductors 42, 44 connecting the second end of the third transmission line 10C in the first set of coupled lines 10 to the second end of the fourth transmission line 20D in the second set of coupled lines 20 and the second end of the fourth transmission line 10D in the first set of coupled transmission lines 10 to the second end of the third transmission line 20C in the second set of coupled transmission lines 20 respectively.

In a third transposition portion 50 the electrical conductors 52, 54 connecting the first end of the second transmission line 10B in the first set of coupled lines 10 to the first end of the third transmission line 20C in the second set of coupled lines 20 and the first end of the third transmission line 10C in the first set of coupled transmission lines 10 to the first end of the second transmission line 20B in the second set of coupled transmission lines 20 respectively.

Figure 5:
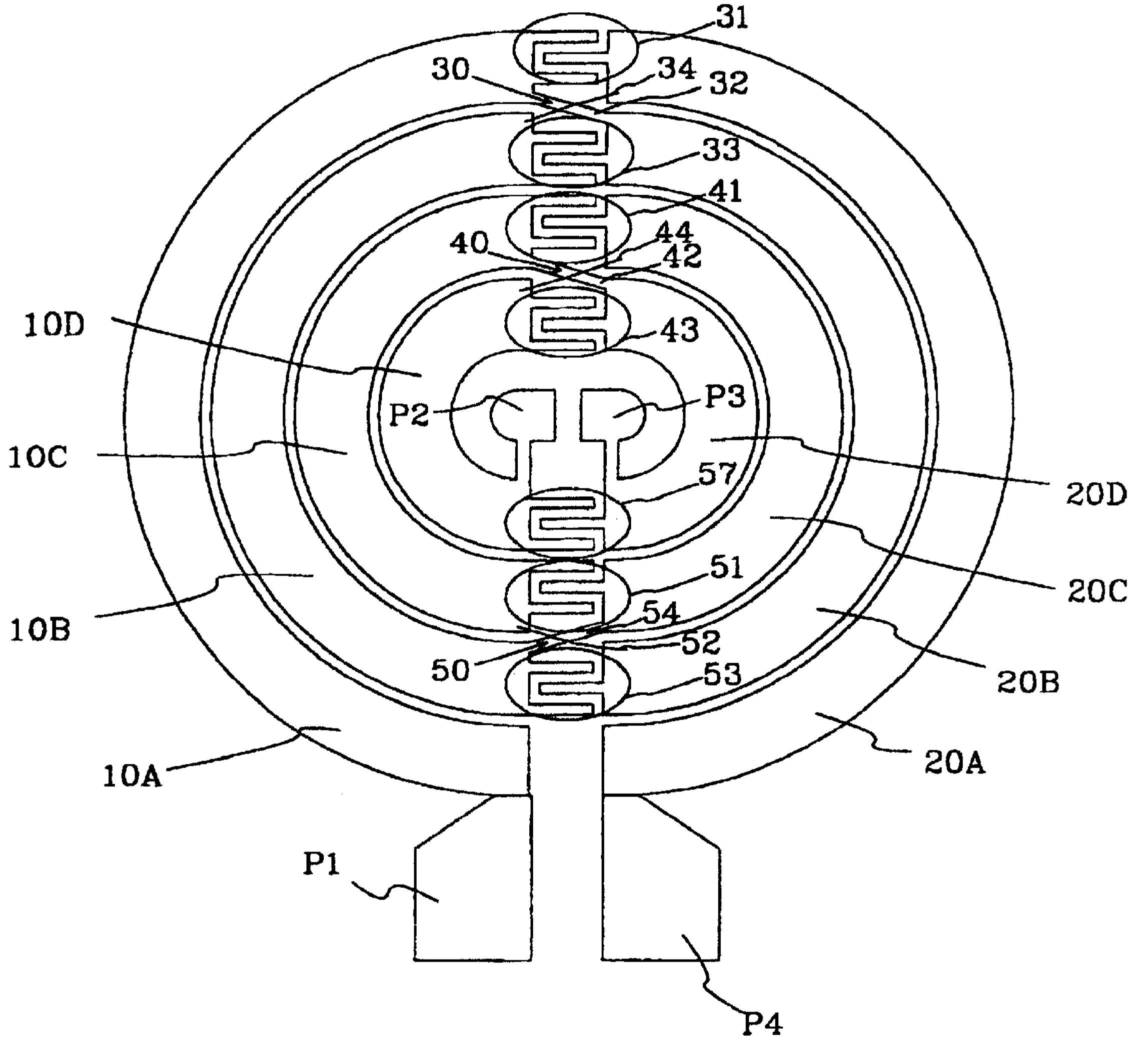
FIG. 5 shows a first physical layout of a four port hybrid according to the first embodiment of the present invention.

With reference to FIG. 5, a physical layout of a four port hybrid 100D according to the invention is shown. The hybrid 100D comprising a first set 10 and a second set 20 of coupled transmission lines. Said first set of coupled transmission lines 10 comprising a first transmission line 10A, a second transmission line 10B, a third transmission line 10C and a fourth transmission line 10D. Said second set of transmission lines 20 comprising a first transmission line 20A, a second transmission line 20B, a third transmission line 20C and a fourth transmission line 20D. In the present embodiment the transmission lines 10A, 10B, 10c, 10D, 20A, 20B, 20C, 20D are C-shaped. The first transmission line 10A, 20A is the longest one and the second 10B, 20B, third 10C, 20C and fourth 10D, 20D are decreasing by gradual stages. Every transmission line 10A, 10B, 10C, 10D in the first set 10 is interacting with each other, that means they are more or less capacitively coupled to each other, the closer the transmission lines are to each other the bigger the coupling between said transmission lines. The same applies to every transmission line in the second set of coupled transmission lines 20.

A first end of the first transmission line 10A in the first set of coupled transmission lines 10 being an input port P1. Said input port P1 in this physical implementation is a pad electrically connected to the end of the first transmission line 10A. Said pad like the transmission lines in the hybrid pattern is for example manufactured by printing, sputtering or etching. A second end of said transmission line 10A is electrically connected to a second end of the second transmission line in the second set of coupled transmission lines via an electrical conductor 32. A first end of the second transmission line 20B in the second set of coupled transmission lines 20 is electrically connected to a first end of the third transmission line 10C in the first set of coupled transmission lines 10 via an electrical conductor 52. A second end of the third transmission line in the first set of coupled transmission lines is electrically connected to a fourth transmission line in the second set of coupled transmission lines via an electrical conductor 42. A first end of the fourth transmission line in the second set of coupled transmission lines being a first output port P3 being formed as a pad and connected to said end of said transmission line. The first transmission line 10A in the first set 10, the second transmission line 20B in the second set 20, the third transmission line 10C in the first set 10 and the fourth transmission line 201 in the second set 20 coupled electrically to each other via said electrical conductors 32, 42, 52 are forming a first spiral shaped electrical conductive path.

A first end of the first transmission line 20A in the second set of coupled lines 20 being a port connectable to ground. A second end of the first transmission line 20A in the second set of coupled transmission lines 20 is electrically connected to a second end of the second transmission line 10B in the first set of coupled transmission lines 10 via an electrical conductor 34. A first end of the second transmission line 10B in the first set of coupled transmission lines 10 is electrically connected to a first end of a third transmission line 20C in the second set of coupled transmission lines 20 via an electrical conductor 54. A second end of the third transmission line 20C in the second set of coupled Ad transmission lines 20 is electrically connected to a second end of a fourth transmission line 10D in the first set of coupled transmission lines via an electrical conductor 44. A first end of the fourth transmission line 10D in the first set of coupled lines being a second output port P2 being like the first output port formed like a pad and connected to the end of said transmission line. The first transmission line 20A in the second set 20, the second transmission line 10B in the first set 10, the third transmission line 20C in the second set 20 and the fourth transmission line 10D in the first set 20 coupled electrically to each other via said electrical conductors 34, 44, 54 are forming a second spiral shaped electrical conductive path.

In the spiral shaped electrical conductive paths every second half turn of said spiral are belonging to the first set of coupled transmission lines and between said half turns the transmission lines belonging to the second set of transmission lines are arranged.

In the embodiment shown in FIG. 5 there are three electrically isolated transposition portions 30, 40, 50 of the first and second spiral shaped conductive paths. In a first transposition portion 30 the electrical conductors 32, 34 connecting the second end of the first transmission line 10A in the first set of coupled lines 10 to the second end of the second transmission line 20B in the second set of coupled lines 20 and the second end of the second transmission line 10B in the first set of coupled transmission lines 10 to the second end of the first transmission line 20A in the second set of coupled transmission lines 20 respectively. In a second transposition portion 40 the electrical conductors 42, 44 connecting the second end of the third transmission line 10C in the first set of coupled lines 10 to the second end of the fourth transmission line 20D in the second set of coupled lines 20 and the second end of the fourth transmission line 10D in the first set of coupled transmission lines 10 to the second end of the third transmission line 20C in the second set of coupled transmission lines 20 respectively. In a third transposition portion 50 the electrical conductors 52, 54 connecting the first end of the second transmission line 10B in the first set of coupled lines 10 to the first end of the third transmission line 20C in the second set of coupled lines 20 and the first end of the third transmission line 10C in the first set of coupled transmission lines 10 to the first end of the second transmission line 20B in the second set of coupled transmission lines 20 respectively.

In every transposition portion in FIG. 5 one of the electrical conductors connecting two transmission lines from different set of coupled transmission lines is printed like the rest of the pattern of the hybrid. The other electrical conductors, isolated from the printed ones are for example bonding wires between the two transmission lines.

Capacitors 51, 53, 57, 43, 41, 33, 31 are arranged like a meander shaped pattern at both ends of the second, third and fourth transmission lines. The meander shaped pattern at the ends of the transmission lines in the first set of coupled transmission lines are adapted to the meander shaped pattern at the ends of the transmission lines in the second set of coupled transmission lines.

In the embodiment in FIG. 5 a capacitor 57 is arranged between the first and second output port. Said capacitor will also contribute to the equalization of the different modes propagating across the hybrid.

Figure 6:
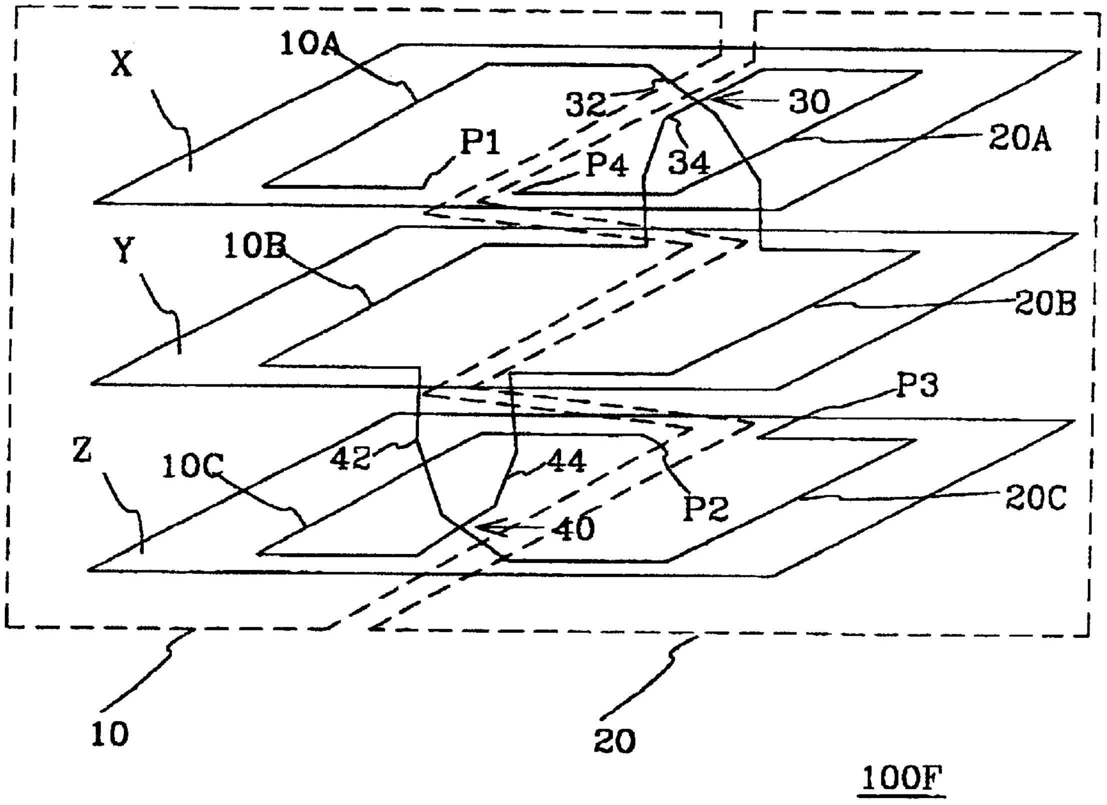
FIG. 6 shows a schematic view of a fifth embodiment of a four port hybrid according to the present invention.

With reference to FIG. 6, a schematic view of a fifth embodiment of a four port hybrid 100F according to the invention is shown. Different layers in the hybrid are separated in the figure for the purpose of clarity, in reality said layers are closely arranged to each other. The hybrid 100F comprising a first set 10 and a second set 20 of coupled transmission lines. Said first set of coupled transmission lines 10 comprising a first transmission line 10A, a second transmission line 10B and a third transmission line 10C. Said second set of transmission lines 20 comprising a first transmission line 20A, a second transmission line 20B and a third transmission line. In the present embodiment the transmission lines 10A, 10B, 10C, 20A, 20B, 20C are C-shaped. The first transmission lines 10A, 20A are arranged on a first layer X in a dielectric substrate, the second transmission lines 10B, 20B are arranged on a second layer Y in the dielectric substrate and the third transmission lines 10C, 20C are arranged on a third layer Z in the dielectric substrate. The different layers X, Y, Z in the substrate are electrically isolated from each other. Every transmission line 10A, 10B, 10C in the first set 10 is interacting with each other, that means they are more or less capacitively coupled to each other, the closer the transmission lines are to each other the bigger the coupling between said transmission lines. The same applies to every transmission line in the second set of coupled transmission lines 20. The shape of the transmission lines in the first set 10 and the second set could as indicated in FIG. 6 be equal. However the length and shape could be different for the different transmission lines 10A, 10B, 10C, 20A, 20B, 20C.

A first end of the first transmission line 10A in the first set of coupled transmission lines 10 being an input port P1. A second end of said transmission line 10A is electrically connected to a second side of the second transmission line 20B in the second set of coupled transmission lines 20 via an electrical conductor 32. A first side of the second transmission line 20B in the second set of coupled transmission lines 20 is electrically connected to a first side of the third transmission line 10C in the first set of coupled transmission lines 10 via an electrical conductor 44. A second side of the third transmission line 10C in the first set of coupled transmission lines 10 being a first output port P2. The first transmission line 10A in the first set 10, the second transmission line 20B in the second set 20 and the third transmission line 10C in the first set 10 are coupled electrically to each other via said electrical conductors 32, 44 and forming a first spiral (helix) shaped electrical conductive path.

A first end of the first transmission line 20A in the second set of coupled lines 20 being a port P4 connectable to ground. A second end of the first transmission line 20A in the second set of coupled transmission lines 20 is electrically connected to a second end of the second transmission line 10B in the first set of coupled transmission lines 10 via an electrical conductor 34. A first end of the second transmission line 10B in the first set of coupled transmission lines 10 is electrically connected to a first end of a third transmission line 20C in the second set of coupled transmission lines 20 via an electrical conductor 42. A second end of the third transmission line 20c in the second set of coupled transmission lines 20 being a second output port P3. The first transmission line 20A in the second set 20, the second transmission line 10B in the first set 10 and the third transmission line 20C in the second set 20 are coupled electrically to each other via said electrical conductors 34, 42 and forming a second spiral (helix) shaped electrical conductive path.

In the spiral shaped electrical conductive paths every second half turn of said spiral are belonging to the first set of coupled transmission lines and between said half turns the transmission lines belonging to the second set of transmission lines are arranged. In this embodiment every second half turn of the spirals are belonging to a different layer compared to the previous half turn if any such half turn is existing in the structure and the next coming half turn if any such half turn in the structure is existing.

In the embodiment shown in FIG. 6 there are two electrically isolated transposition portions 30, 40 of the first and second spiral shaped conductive paths. Said electrically isolated transposition portions 30, 40 can be looked upon as four port cross connectors. In a first transposition portion 30 the electrical conductors 32, 34 connecting the second end of the first transmission line 10A in the first set of coupled lines 10 to the second end of the second transmission line 20B in the second set of coupled lines 20 and the second end of the second transmission line 10B in the first set of coupled transmission lines 10 to the second end of the first transmission line 20A in the second set of coupled transmission lines 20 respectively.

In a second transposition portion 40 the electrical conductors 42, 44 connecting the first end of the third transmission line 10C in the first set of coupled lines 10 to the first end of the second transmission line 20B in the second set of coupled lines 20 and the first end of the second transmission line 10B in the first set of coupled transmission lines 10 to the first end of the third transmission line 20C in the second set of coupled transmission lines 20 respectively.

The hybrid with N coupled transmission lines will have (N−1) transposition portions.

The hybrid can have a first capacitor coupled between ground and the input port.

The transmission lines can be of any shape for example straight lines or meander shaped instead of the above mentioned C shaped transmission lines The invention being thus described, it will be obvious that the same may be varied in a plurality of ways. Such variations are not to be regarded as a departure from the scope of the invention. All such modifications as would be obvious to one skilled in the art are intended to be included within the cope of the appended claims.

What is claimed is:

1. A four port hybrid comprising a first set (10) of N coupled transmission lines (10A, 10B, 10C, 10D, 10E, 10F, 10G, 10H, 10I) and a second set (20) of N coupled transmission lines (20A, 20B, 20C, 20D, 20E, 20F, 20G, 20H, 20I) where $N \geqq 3$, said coupled transmission lines in said first set (10) are electrically connected to said coupled transmission lines in said second set (20) to form a first spiral shaped electrical conductive path, a second spiral shaped electrical conductive path and N−1 electrically isolated transposition portions (30, 40, 50, 60, 70, 80, 90, 110) of said first and second spiral shaped electrical conductive paths, where a first end of the first spiral being an input port (P1), a first end of the second spiral being a terminated port (P4), a second end of the first spiral being a first output port (P3), a second end of the second spiral being a second output port (P2).

2. A four port hybrid according to claim 1, characterised in that said first set (10) of N coupled transmission lines is a mirror image of said second set (20) of N coupled lines.

3. A four port hybrid according to claim 1, characterised in that said transmission lines in said first and second set (10) of coupled transmission lines are C-shaped.

4. A four port hybrid according to claim 1, characterised in that the first (10) and second (20) set of transmission lines and the electrical connection between them are arranged on one side of a dielectric substrate.

5. A four port hybrid according to claim 1, characterised in that at least one of the transmission lines is arranged on a first side of the dielectric substrate and the rest of the transmission lines are arranged on the second side of said dielectric substrate.

6. A four port hybrid according to claim 1, characterised in that a first transmission line (10A, 20A) in the first and second set (10, 20) are arranged on a first layer (X) in the dielectric substrate, a second transmission line (103, 20B) in the first and second set (10, 20) are arranged on a second layer (Y) in the dielectric substrate and a N:th transmission line in the first and second set (10, 20) are arranged on a N:th layer in the dielectric substrate, where said layers are electrically isolated from each other.

7. A four port hybrid according to claim 1, characterised in that at least one isolated transposition portion (30, 40, 50, 60, 70, 80, 90 110) having two capacitors (51, 53, 41, 43, 31, 33) being arranged between the ends of the transmission lines in such a manner to form further RF connections, which capacitors will equalise phase velocities for all modes propagating in the hybrid.

8. A four port hybrid according to claim 1, characterised in that a capacitor (57) is arranged between the first output port and the second output port (P2, P3).

* * * * *